(12) United States Patent
Cho et al.

(10) Patent No.: US 8,508,990 B2
(45) Date of Patent: Aug. 13, 2013

(54) NON-VOLATILE MEMORY DEVICE, OPERATION METHOD THEREOF, AND DEVICES HAVING THE NON-VOLATILE MEMORY DEVICE

(75) Inventors: Kyoung Lae Cho, Yongin-si (KR); Hyuck-Sun Kwon, Seoul (KR); Jun Jin Kong, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 167 days.

(21) Appl. No.: 13/071,727

(22) Filed: Mar. 25, 2011

(65) Prior Publication Data

US 2011/0249495 A1    Oct. 13, 2011

(30) Foreign Application Priority Data

Apr. 8, 2010  (KR) .................. 10-2010-0032242

(51) Int. Cl.
*G11C 16/04* (2006.01)
(52) U.S. Cl.
USPC ............ 365/185.03; 365/185.14; 365/189.05; 365/230.08
(58) Field of Classification Search
USPC .............. 365/185.03, 185.14, 189.05, 230.08
See application file for complete search history.

(56) References Cited

U.S. PATENT DOCUMENTS

| 5,936,884 | A | 8/1999 | Hasbun et al. | |
|---|---|---|---|---|
| 6,335,881 | B2* | 1/2002 | Kim et al. | 365/185.18 |
| 6,667,903 | B2 | 12/2003 | De Sandre et al. | |
| 6,836,432 | B1 | 12/2004 | Parker et al. | |
| 6,930,919 | B2* | 8/2005 | Lee et al. | 365/185.11 |
| 7,064,986 | B2* | 6/2006 | Lee et al. | 365/185.28 |
| 7,652,948 | B2* | 1/2010 | Lee et al. | 365/230.08 |
| 7,773,427 | B2* | 8/2010 | Park et al. | 365/185.22 |
| 7,817,470 | B2* | 10/2010 | Kim | 365/185.11 |
| 7,835,191 | B2* | 11/2010 | Lee | 365/185.25 |
| 7,894,266 | B2* | 2/2011 | Lee | 365/185.17 |

FOREIGN PATENT DOCUMENTS

JP     2004-240572     8/2004

* cited by examiner

*Primary Examiner* — Pho M Luu
(74) *Attorney, Agent, or Firm* — Muir Patent Consulting, PLLC

(57) ABSTRACT

A non-volatile memory device includes a memory cell array including a plurality of multi-level cells each storing data corresponding to one of a plurality of states of a first group of states, and a control circuit. The control circuit is configured to program data corresponding to one of the plurality of states in a first multi-level cell according to a first verify voltage level of a first group of verify voltage levels, and to control the first multi-level cell to be re-programmed to one of a plurality of states of a second group of states according to a first verify voltage level of a second group of verify voltage levels. Each voltage level of the second group of verify voltage levels has a higher level than the verify voltage levels of the first group of verify voltage levels.

20 Claims, 9 Drawing Sheets

NON-VOLATILE MEMORY DEVICE, OPERATION METHOD THEREOF, AND DEVICES HAVING THE NON-VOLATILE MEMORY DEVICE

CROSS-REFERENCE TO RELATED APPLICATIONS

This application claims priority under 35 U.S.C. §119 to Korean Patent Application No. 10-2010-0032242 filed on Apr. 8, 2010, the disclosure of which is hereby incorporated by reference in its entirety.

BACKGROUND

Embodiments disclosed herein relate to a non-volatile memory device, and more particularly, to a non-volatile memory device which may program data by page without an erase, an operation method thereof, and devices having the non-volatile memory device.

A non-volatile memory device retains data stored in the non-volatile memory device, even though an external power supply is shut off. For example, a flash memory device is a non-volatile memory device which may perform a program operation and an erase operation electrically. The flash memory device may be divided in a NAND-type flash memory and a NOR-type flash memory.

The flash memory device typically performs an erase operation by block and performs a program operation by page. Generally, a block consists of 32 to 64 pages.

A difference of processes performed during the erase operation and the program operation may cause various problems. For example, when it is desired to correct only data stored in a particular page while other pages of a block are to remain unchanged, a typical flash memory device must still erase all of the pages of the block, and then re-write both the data to be corrected and the other pages of data. Such a method lowers a process speed and increases a number of program/erase (P/E) cycles, so that reliability and longevity of the flash memory device can be worsened.

SUMMARY

The disclosed embodiments provide, when correcting data stored in a page, a non-volatile memory device which may improve its speed by correcting data stored in a page, a non-volatile memory device which may improve its speed by correcting data by page without an erase operation and improve reliability by reducing the number of erase operations. An operating method thereof, and devices performing the method are also disclosed.

According to one embodiment, a non-volatile memory device is disclosed. The non-volatile memory device includes a memory cell array including a plurality of multi-level cells each storing data corresponding to one of a plurality of states of a first group of states, and a control circuit. The control circuit is configured to program data corresponding to one of the plurality of states in a first multi-level cell according to a first verify voltage level of a first group of verify voltage levels, and to control the first multi-level cell to be re-programmed to one of a plurality of states of a second group of states according to a first verify voltage level of a second group of verify voltage levels. Each voltage level of the second group of verify voltage levels has a higher level than the verify voltage levels of the first group of verify voltage levels. One of the plurality of states of the second group of states includes at least one of the plurality of states of the first group of states.

In further embodiment, a program method for a non-volatile memory device is disclosed. The method includes programming a first multi-level cell among multi-level cells of the non-volatile memory device to a first state of a first group of states according to a first verify voltage level of a first group of verify voltage levels. The method further includes re-programming the first multi-level cell to a first state of a second group of states according to a first verify voltage level of a second group of verify voltage levels. Each verify voltage level of the second group of verify voltage levels has a higher verify voltage level than any verify voltage levels of the first group of verify voltage levels. One of the states of the second group of states includes at least one of the states of the first group of states.

In another embodiment, a read method is disclosed. The method includes providing a first read voltage to a selected word line to read a particular bit of a multi-bit memory cell. The method further includes determining whether the memory cell is in a re-programmed state based on the first provided read voltage. The method additionally includes providing a second read voltage to the selected word line to read the particular bit of the memory cell, when it is determined that the memory cell is not in a re-programmed state. The method additionally includes reading the particular bit according to the second read voltage. The level of the second read voltage is smaller than a level of the first read voltage.

BRIEF DESCRIPTION OF THE DRAWINGS

These and/or other aspects and advantages of the disclosure will become apparent and more readily appreciated from the following description of the embodiments, taken in conjunction with the accompanying drawings of which.

DETAILED DESCRIPTION

Figure 1:
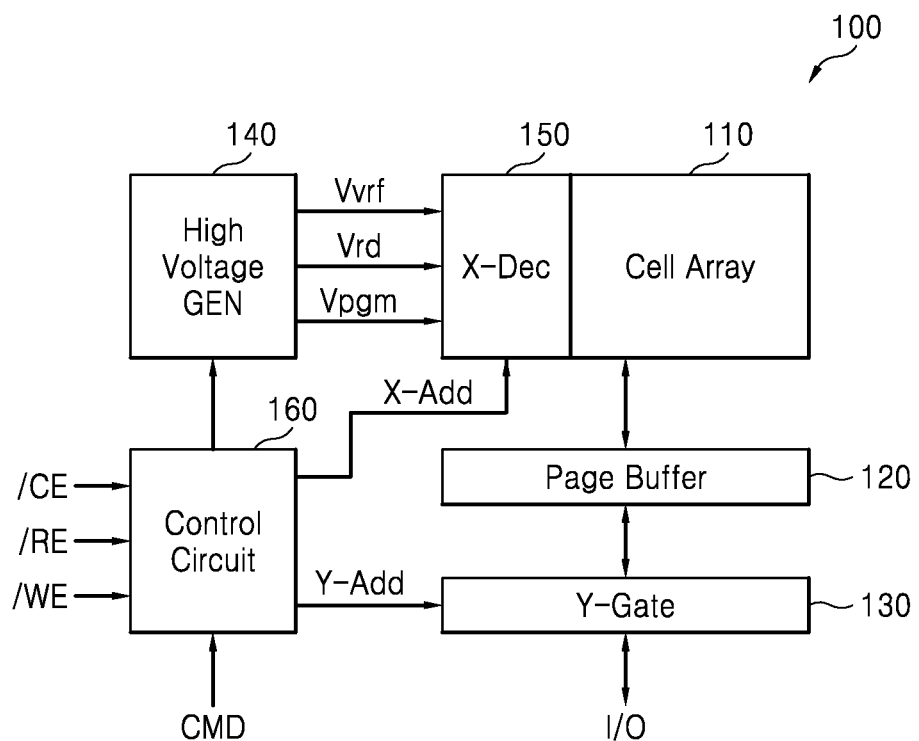
FIG. 1 shows a block diagram of a multi-level non-volatile memory device according to an exemplary embodiment.

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of this disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two steps or figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the disclosure is not limited to example embodiments described.

Figure 2:
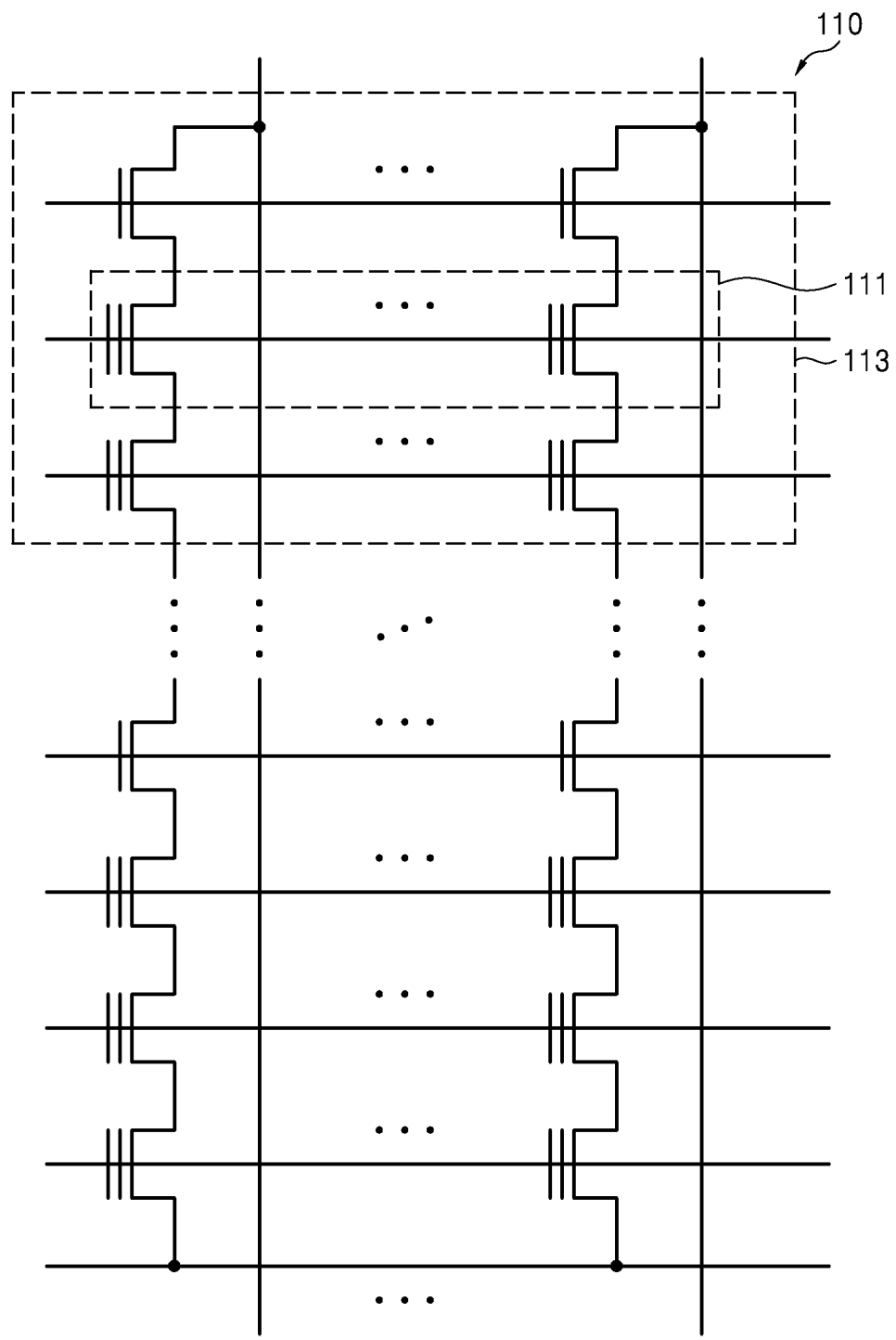
FIG. 2 shows an exemplary circuit diagram of a memory cell array illustrated in FIG. 1.

FIG. 1 shows a block diagram of a non-volatile memory device 100 according to an exemplary embodiment, and FIG. 2 shows an exemplary circuit diagram of a memory cell array illustrated in FIG. 1.

Referring to FIGS. 1 and 2, in one embodiment, the non-volatile memory device 100 includes a memory cell array 110, a page buffer 120, a Y-gating circuit 130, a high voltage generator 140, a row decoder 150 and a control circuit 160.

The memory cell array 110 includes a plurality of multi-level cells each storing a plurality of bits. The stored plurality of bits may be represented by a plurality of respective states. Each of the plurality of multi-level cells may store bit data of 2 or more bits. In one embodiment, each of the plurality of multi-level cells is connected to a bit line and a word line. A page (111) refers to a collection of a plurality of multi-level cells connected to a word line. As used herein, a "page" refers to the smallest unit of programming data. A block (113) refers to a collection of pages. As used herein, a "block" refers to the smallest unit of erasing data.

The page buffer 120 may operate as a sense amplifier or a write driver according to an operation mode. For example, the page buffer 120 operates as the sense amplifier to read data from the memory cell array 110 during a read operation. The page buffer 120 may sense data stored in the plurality of multi-level cells.

During a program operation, the page buffer 120 operates as a write driver to drive bit lines according to data to be stored in the memory cell array 110. The page buffer 120 may load data to be programmed in the memory cell array 110 and loaded data may be transmitted to a bit line and programmed in memory cells.

The Y-gating circuit 130 may transmit data latched onto the page buffer to an input/output buffer (not shown) according to a column address Y-Add during a read operation. During a program operation, the Y-gate 130 may transmit input data to the page buffer 120.

The high voltage generator 140 may generate a word line voltage supplied to the cell array 110. The high voltage generator 140 may generate various word line voltages according to each operation mode and supply generated word line voltages to selected word lines. During a program operation, the high voltage generator 140 may generate a program voltage Vpgm and supply it to a selected word line. During a read operation, the high voltage generator 140 may supply a read voltage Vrd for reading selected data from a selected word line. During a verify operation, the high voltage generator 140 may supply a verify voltage Vvrf for verifying selected data on a selected word line.

The row decoder 150 may select a word line according to a row address X-Add. The row decoder 150 may transmit a generated word line voltage from the high voltage generator 140 to the selected word line.

The control circuit 160 may control a voltage generation of the high voltage generator 160 for a program operation, a verify operation, a read operation or an erase operation in response to a control signal /CE, a read enable signal /RE, a write enable signal /WE, or a command signal CMD, which are supplied from outside the non-volatile memory device 100. In one embodiment, the control circuit 160 may control a level of a verify voltage Vvrf so as to re-program a plurality of bits in a plurality of programmed multi-level cells without erasing data corresponding to a block 113 when correcting one of a plurality of programmed multi-level cells. That is, to correct a programmed multi-level cell of a page in a block, data may be re-programmed to the page of the block without the need to erase the other pages of the block prior to re-programming.

Figure 3:
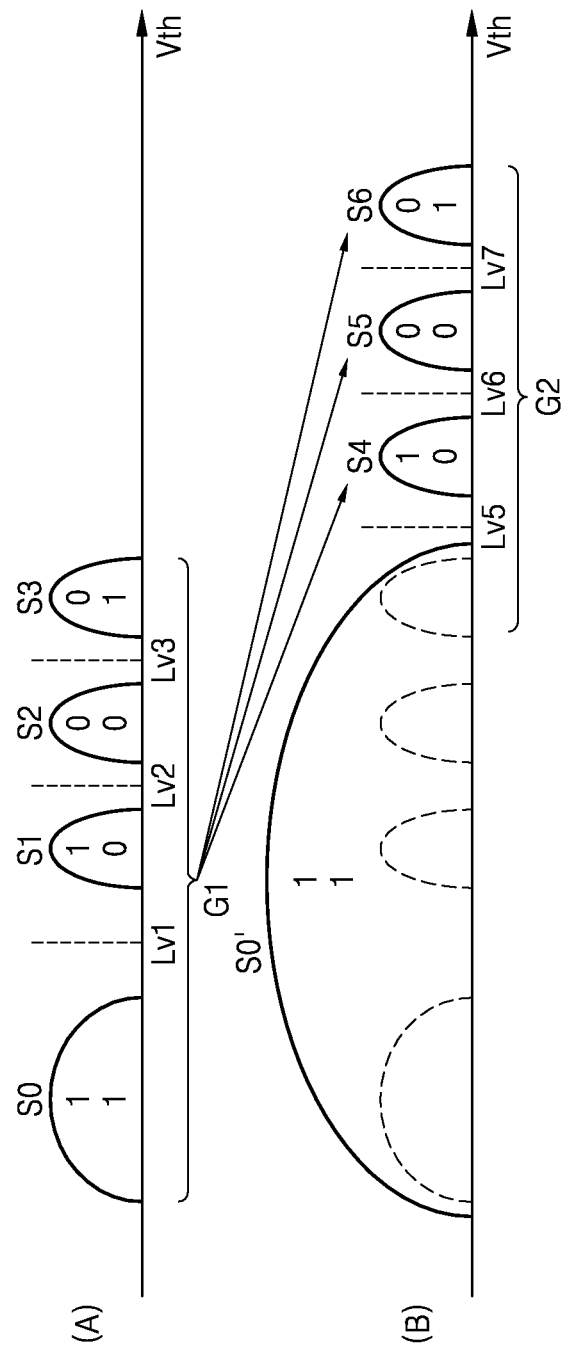
FIG. 3 is a distribution diagram showing a program state distribution of multi-level cells according to one exemplary embodiment.

FIG. 3 is a distribution diagram showing a program state distribution of multi-level cells according to one exemplary embodiment. Referring to FIGS. 1 to 3, each of a plurality of multi-level cells may store bit data of 2 bits or more, however, a multi-level cell storing two bit data is explained for convenience of explanation.

FIG. 3(A) illustrates a program state distribution of multi-level cells programmed according to levels of a first group. A first group G1 of FIG. 3(A) includes four states S0, S1, S2 and S3 and three levels Lv1, Lv2 and Lv3 for distinguishing or defining each of the four states.

FIG. 3(B) illustrates a program state distribution of multi-level cells re-programmed according to levels of a second group. A second group G2 of FIG. 3(B) includes four states S0', S4, S5 and S6 and three levels Lv5, Lv6 and Lv7 for distinguishing or defining each of the three states.

Each of the described first group G1 and second group G2 describe a different set of levels that indicate different states that correspond to respective data. Each of levels Lv1 to Lv3 and Lv5 to Lv7 refer a verify voltage (Vvrf) level for programming in multi-level cells.

A method for mapping a plurality of two bit data in the four states S0, S1, S2 and S3 may be varied. For example, two bit data may be mapped in an order of 11, 10, 00, and 01 according to an order of each of the four states S0, S1, S2 and S3. According to other embodiments, an order of mapping a data bit can be different.

A program operation may be performed according to an Incremental Step Pulse Programming ISPP mode. The ISPP mode includes a program operation and a verify operation.

The program operation is an operation during which the high voltage generator 140 generates a program voltage Vpgm and supplies it to a selected word line. The verify operation is an operation during which the high voltage generator 140 generates a verify voltage Vvrf, supplies it to a selected word line, and determines if the multi-level cells are programmed.

In one embodiment, the control circuit 160 initially controls the plurality of bits to be programmed in a first multi-level cell according to one of levels Lv1, Lv2 and Lv3 of a first group G1. For example, the control circuit 160 may set a level of a verify voltage Vvrf to a second level Lv2 so as to program a bit data of '00' in the first multi-level cell. The first multi-level cell refers to one of a plurality of multi-level cells located in the cell array 110.

The control circuit 160 may, however, set or change an ISPP condition. In one embodiment, the ISPP condition includes applying a program voltage Vpgm, applying a verify voltage Vvrf, increasing the amount of program voltage Vpgm, and then repeating the process a number of times. However, the ISPP procedure may occur according to different known procedures.

In one embodiment, when correcting one of a plurality of programmed multi-level cells of a block, such as block 113, the control circuit 160 controls a plurality of programmed bits to be re-programmed in the plurality of multi-level cells by increasing a first group G1 of levels, Lv1 Lv2 and Lv3, to a second group G2 of levels, Lv5, Lv6 and Lv7 without erasing data corresponding to the block 113. For example, a page 111 may include the first multi-level cell and a second multi-level cell. The non-volatile memory device 100 is programmed by page, and the page 111 may be re-programmed without erasing other pages of the block 113.

For example, according to the first group G1 of levels, a bit data of '00' may be programmed in the first multi-level cell according to a second level Lv2 and a bit data of '01' may be programmed in the second multi-level cell according to a third level Lv3.

However, in a subsequent operation, when correcting a bit data of '00' programmed in the first multi-level cell into a bit data of '10', the control circuit 160 sets a second level Lv2 to a fifth level Lv5 so as to program a bit data of '10'. A bit data of '00' is re-programmed into a bit data of '10' according to a fifth level Lv5. That is, the controller is set such that during a re-programming operation, it uses the second group G2 of levels to program the same cells that were programmed with the first group G1 of levels during the initial program operation. As such, during a re-programming operation, a fifth level Lv5 indicates a bit data of '10' for the cell.

Therefore, a plurality of programmed bits are re-programmed in each of programmed multi-level cells including a cell to be corrected according to levels Lv5, Lv6 and Lv7 of a second group G2. For example, to re-program a page of cells including correcting a first multi-level cell of the page from bit data '00' to bit data '10' and re-programming a second multi-level cell of the page to bit data '01, the control circuit 160 sets a program level of a bit data of '10' to a fifth level Lv5 from a second level Lv2, sets a program level of a bit data of '01' to a seventh level Lv7 from a third level Lv3, and programs the first and second cells accordingly.

The bit data of '01' may be re-programmed into a bit data of '01' according to the seventh level Lv7. Accordingly, the non-volatile memory device 100 may re-program the first multi-level cell where a bit data of '00' is programmed into a bit data of '10' without erasing data corresponding to the block 113 by increasing a verify voltage (Vvrf) level.

For convenience of explanation, the non-volatile memory device 100 explains re-programming by using levels Lv5, Lv6 and Lv7 of a second group G2. In addition, the non-volatile memory device 100 may further re-program a page of memory cells using up to a N groups, where N is an integer of 3 or more, within an acceptable verify voltage level range.

In the embodiment described above, a state S0' of a second group G2 includes at least one state of a first group G1. By setting the states S0, S1, S2 and S3 of the first group G1 to the state S0' of the second group G2, the non-volatile memory device 100 may reduce the number of additional states (e.g., S4, S5 and S6) needed to represent the data for the second group G2. In one embodiment, as shown in FIG. 3, a state S0' of a second group G2 may include all states of the first group G1.

Figure 4:
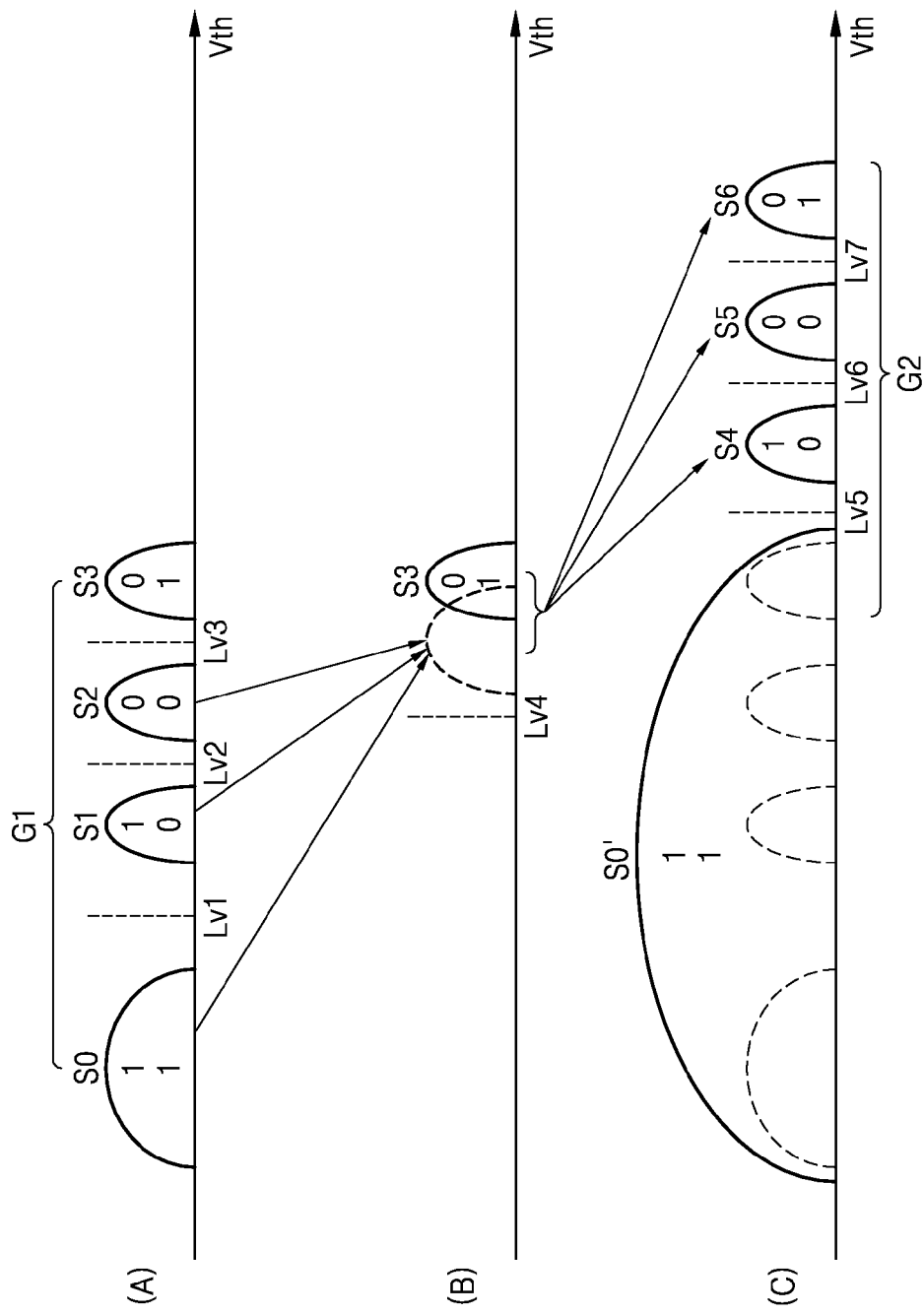
FIG. 4 is a distribution diagram showing a program state distribution of multi-level cells according to another exemplary embodiment.

FIG. 4 is a distribution diagram showing a program state distribution of multi-level cells according to another exemplary embodiment. FIG. 4(A) illustrates a program state distribution of multi-level cells programmed according to levels of a first group. FIG. 4(B) illustrates a program state distribution where one of the levels of the first group to be increased to each level of the second group is increased up to a random level in the first group. FIG. 4(C) illustrates a re-program state distribution of multi-level cells re-programmed according to levels of the second group.

Referring to FIGS. 1 to 4, when correcting one of programmed multi-level cells, the control circuit 160 controls one of levels Lv1 and Lv2 of the first group to be increased up to an arbitrary, separate level Lv4. The separate level Lv4 may be, for example, within a range of the levels included in the first group G1, but may be different from the levels included in the first group G1 and also different from the levels included in the second group G2.

The arbitrary level Lv4 may have a range between a second level Lv2 and a third level Lv3. For example, the non-volatile memory device 100 may re-program the plurality of programmed bits in a state S0, a first state 51 or a second state S2 in a first group G1 in multi-level cells in accordance with the arbitrary level Lv4.

The non-volatile memory 100 may reduce a coupling effect by re-programming the plurality of bits in multi-level cells according to the arbitrary level Lv4 when performing a re-program operation according to levels of a second group G2. Re-programming by shifting from the arbitrary level Lv4 to levels of the second group G2 has less shift of voltage than re-programming by shifting from levels Lv1 and Lv2 of the first group G1 to levels Lv5, Lv6 and Lv7 of the second group G2.

Figure 5:
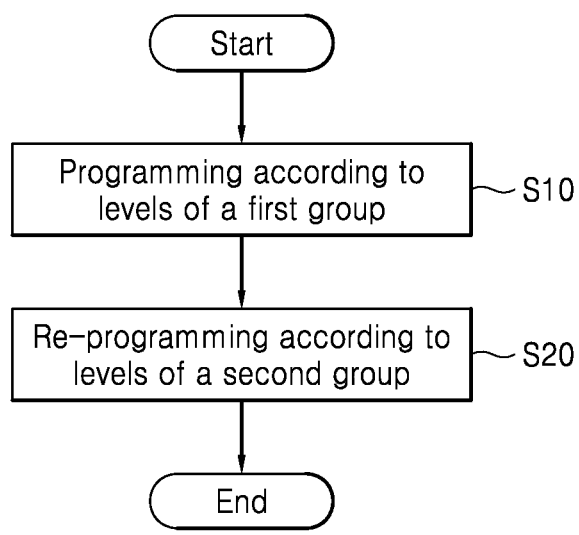
FIG. 5 is a flowchart for explaining an exemplary program operation of the non-volatile memory device illustrated in FIG. 1.

FIG. 5 is a flowchart for explaining an exemplary program operation of the non-volatile memory device illustrated in FIG. 1. Referring to FIGS. 1 to 5, the non-volatile memory device 100 programs the plurality of bits in multi-level cells according to levels Lv1, Lv2 and Lv3 of the first group G1 (S10).

The program operation is performed in an ISPP mode. Once the program operation is performed, multi-level cells have distribution like FIG. 3(A). The non-volatile memory device 100 then re-programs a plurality of programmed bits in the first multi level cell according to levels Lv5, Lv6 and Lv7 of the second group each having a higher level than programmed levels Lv1, Lv2 and Lv3 of a first group (S20).

The control circuit 160 controls each level Lv1, Lv2 or Lv3 of the first group G1 to be increased up to each level Lv5, Lv6 or Lv7 of the second group G2. The control circuit 160 sets states S0, S1, S2 and S3 of the first group G1 to one of the states of the second group. For example, states S0, S1, S2 and S3 of the first group G1 may be set to an erase state S0'. Accordingly, the non-volatile memory device 100 may correct multi-level cells by page without erasing a block. Additionally, states to be added in the second group may be adjusted by the control circuit 160. For example, a situation may arise where re-programming data only uses three values (i.e., "11", "10", and "00"). In such a situation, only two additional states of the second group G2 may need to be added by the non-volatile memory device 100.

Figure 6:
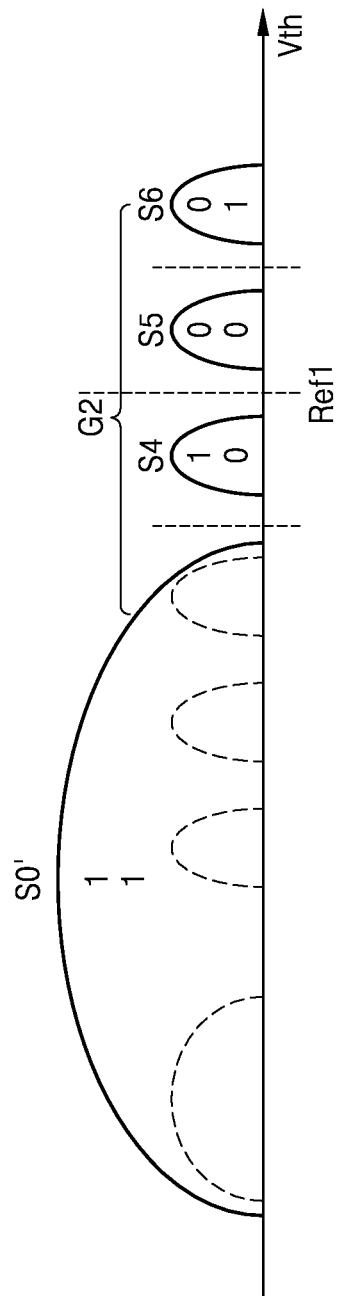
FIG. 6 is a distribution diagram for explaining a read operation of multi-level cells according to one exemplary embodiment.
Figure 7:
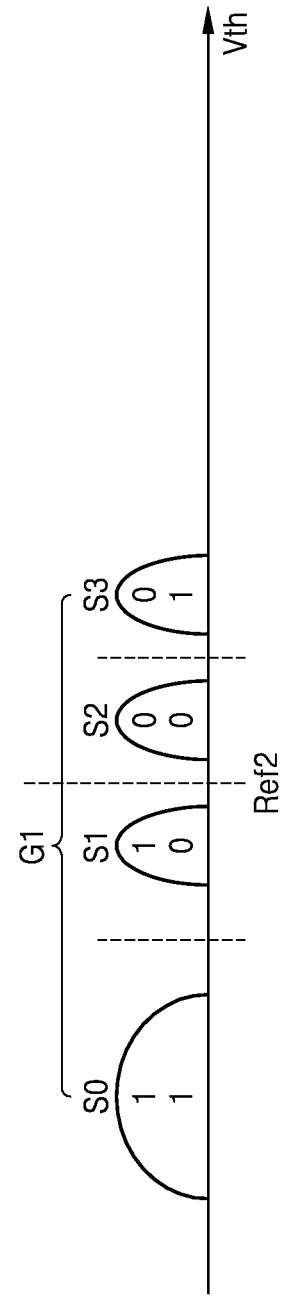
FIG. 7 is a distribution diagram for explaining a read operation of multi-level cells according to another exemplary embodiment.
Figure 8:
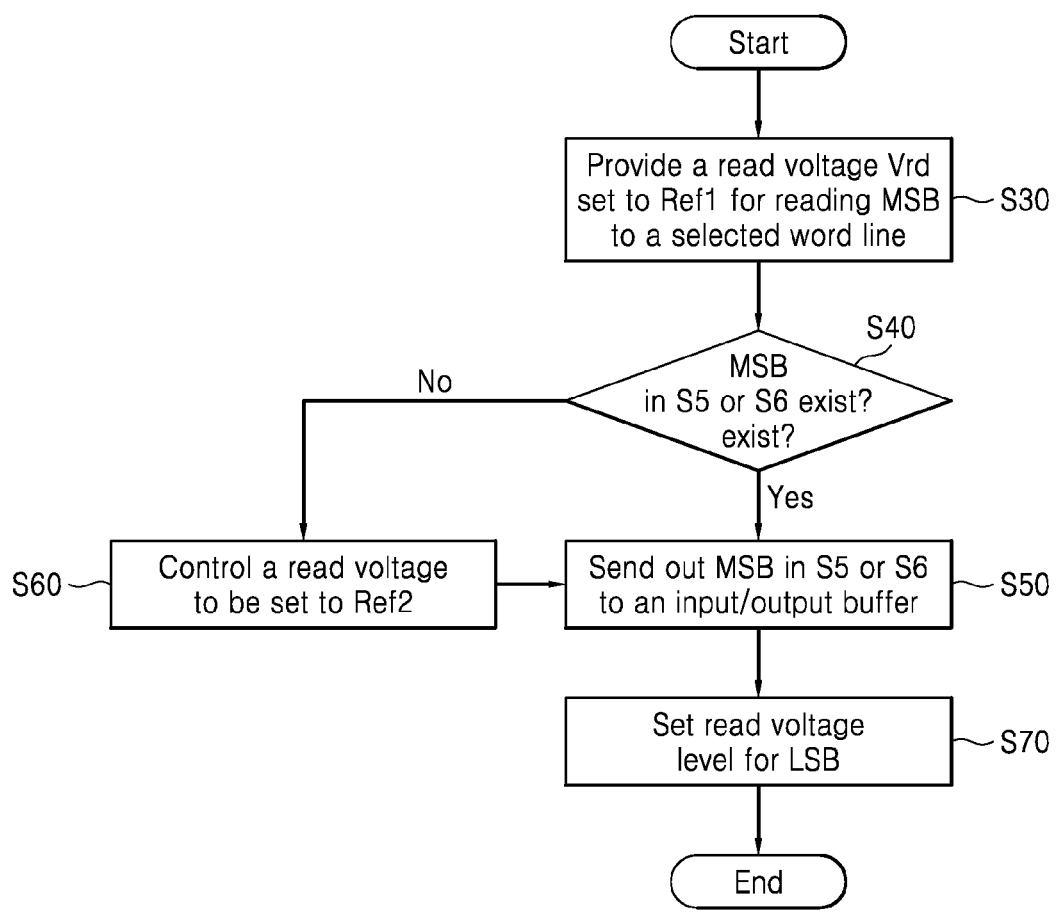
FIG. 8 is a flowchart for explaining an exemplary read operation of the non-volatile memory device illustrated in FIG. 1.

FIG. 6 is a distribution diagram for explaining a read operation of multi-level cells according to an exemplary embodiment, FIG. 7 is a distribution diagram for explaining a read operation of multi-level cells according to another example embodiment, and FIG. 8 is a flowchart for explaining an exemplary read operation of the non-volatile memory device illustrated in FIG. 1.

Referring to FIGS. 1, and 6 to 8, the non-volatile memory device 100 reads a least significant bit (LSB) data after reading a most significant bit (MSB) data among a plurality of bit data stored in a plurality of multi-level cells. For example, when bit data are '11', '10', '00' and '01', the non-volatile memory device 100 first determines if the most significant bit MSB is '1' (e.g., the cell is within the distribution including bit data '11' and '10') or '0' (the cell is within the distribution including bit data '00' and '01').

The control circuit 160 controls a read voltage Vrd to be set to a first read voltage level Ref1. The setting is for performing a read operation of the most significant bit MSB data in a fifth state S5 or in a sixth state S6 of the second group G2. The second group G2 includes state S0' and a fourth state S4 to a sixth state S6.

The high voltage generator 140 provides a read voltage Vrd, which is set to the first read voltage level Ref1, to a selected word line to read the most significant bit data in one of a fifth state S5 and a sixth state S6 which are selected (S30). The read voltage Vrd may be determined in response to read flag cell data stored in a page unit or a block unit of a memory device. Furthermore, the read voltage Vrd may be determined based on the previous setting read voltage level.

The page buffer 120 operates as a sense amplifier during a read operation. The page buffer 120 determines whether any of the cells in the page are programmed in either a fifth state S5 or a sixth state S6. If so, then it is determined that the page has been re-programmed, and the Y-gate 130 transmits the most significant bit data in the fifth state S5 or the sixth state S6, which are latched onto the page buffer 120, to an input/output buffer (not shown) (S50). When the page buffer 120 determines that none of the cells in the page are programmed in either a fifth state S5 or a sixth state S6, then the control circuit 160 determines that the page has not been re-programmed, and controls a read voltage Vrd to be set to a second read voltage level Ref2 (S60).

The setting is for performing a read operation of the most significant bit data in a second state S2 or a third state S3 of a first group. The first group G1 includes a 0 state S0 to a third state S3.

The high voltage generator 140 provides a read voltage Vrd, which is set to the second read voltage level Ref2 so as to read the most significant bit data in one of the second state S2 or the third state S3, which are selected, to a selected word line. The page buffer 120 reads the most significant bit in the second state S2 and the third state S3 programmed in a plurality of memory cells.

The Y-gating circuit 130 transmits the most significant bit in the second state S2 and the third state S3, which is latched onto the page buffer 120, to an input/output buffer (not shown) in response to a column address Y-Add (S50). The non-volatile memory device 100 performs the least significant bit (LSB) read operation (S70). As a cell ordering of the first group G1 is equal to one of the second group G2, the non-volatile memory device 100 does not need a process of changing data during a data read operation.

Figure 9:
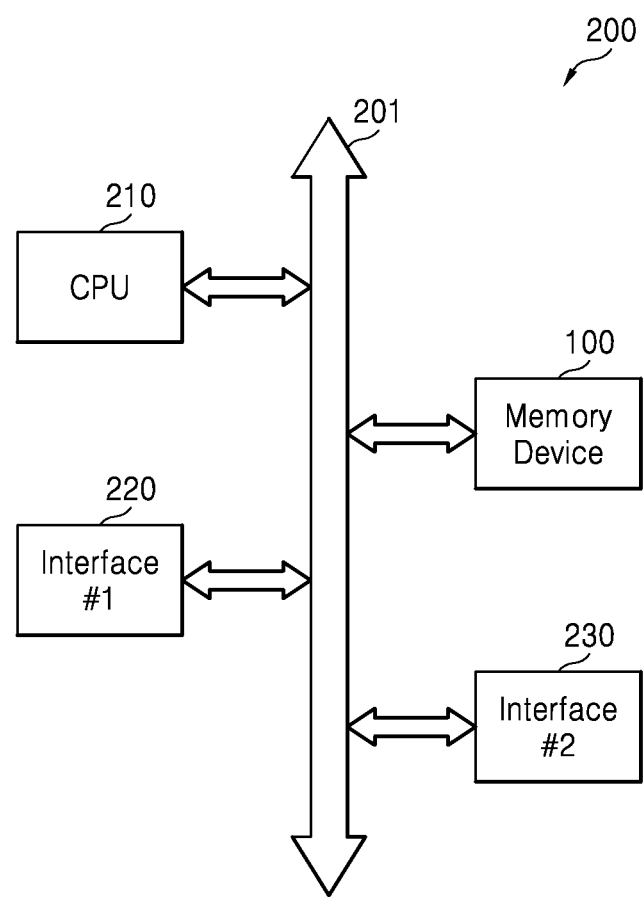
FIG. 9 shows a block diagram of an exemplary memory system including the non-volatile memory device illustrated in FIG. 1.

FIG. 9 shows a block diagram of a memory system including the non-volatile memory device illustrated in FIG. 1. Referring to FIGS. 1 to 9, a memory system 200 may be embodied in a personal computer (PC), a portable computer, a smart phone, a handheld communication device, a digital TV, a net-book, an e-book or a home automation device.

The memory system 200 may include the non-volatile memory device 100 and a CPU 210, which are connected to each other through a system bus 201. The CPU 210 may control a general operation, e.g., a program operation or a read operation, of the non-volatile memory device 100 explained in FIGS. 1 to 8.

The non-volatile memory device 100 may be embodied by using various packages such as a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SS0P), a Thin Small Outline (TS0P), a System In Package (SIP), a Multi Chip Package (MCP), a Wafer-level Fabricated Package (WFP), a Wafer-Level Processed Stack Package (WSP) and so on.

The computer system 200 may further include a first interface 220. The first interface 220 may be an input/output interface. The input/output interface may be an output device such as a monitor or a printer, or may be an input device such as a mouse or a keyboard. The computer system 200 may further include a second interface 230. The second interface 230 may be a wireless communication interface for a radio communication with an external computer system.

The non-volatile memory device according to an example embodiment of the present invention, an operation method thereof and devices including the same may improve a process speed by correcting data by page without an erase, and may improve reliability of the non-volatile memory device by reducing the number of an erase operation.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A non-volatile memory device comprising:
    a memory cell array including a plurality of multi-level cells each storing data corresponding to one of a plurality of states of a first group of states; and
    a control circuit configured to program data corresponding to one of the plurality of states in a first multi-level cell according to a first verify voltage level of a first group of verify voltage levels, and to control the first multi-level cell to be re-programmed to one of a plurality of states of a second group of states according to a first verify voltage level of a second group of verify voltage levels, each voltage level of the second group of verify voltage levels having a higher level than the verify voltage levels of the first group of verify voltage levels,
    wherein one of the plurality of states of the second group of states includes at least one of the plurality of states of the first group of states.

2. The non-volatile memory device of claim 1, wherein a first state of the plurality of states of the second group of states includes all of the plurality of states of the first group of states.

3. The non-volatile memory device of claim 2, wherein the first state of the plurality of states of the second group of states is an erase state.

4. The non-volatile memory device of claim 1, wherein the control circuit is configured to control the first verify voltage level of the first group of verify voltage levels, prior to raising it to the first verify voltage level of the second group of verify voltage levels, to be raised to a separate verify voltage level.

5. The non-volatile memory device of claim 4, wherein the separate verify voltage level is smaller than a highest verify voltage level in the first group of verify voltage levels.

6. The non-volatile memory device of claim 1, wherein the first group of states includes n states, the control circuit controls the first through n−1th states of the first group of states, prior to changing respective ones of the first through n−1th states to one of the plurality of states of the second group of states, to be changed to a separate state.

7. The non-volatile memory device of claim 6, wherein a verify voltage level corresponding to the separate state is smaller than a highest verify voltage level associated with the first group of states.

8. The non-volatile memory device of claim 1, wherein the number of states of the second group of states may be adjusted by the control circuit.

9. A memory system comprising:
    the non-volatile memory device of claim 1; and
    a processor controlling the non-volatile memory device.

10. The memory system of claim 9, wherein one of the plurality of states of the second group of states includes all of the plurality of states of the first group of states.

11. The memory system of claim 9, wherein the first group of verify voltage levels includes a range of voltage levels, and the control circuit is configured to control the first verify voltage level of the first group of verify voltage levels, prior to raising it to the first verify voltage level of the second group of verify voltage levels, to be increased to a separate verify voltage level within the range of voltage levels.

12. The memory system of claim 9, wherein the number of states of the second group of states may be adjusted by the control circuit.

13. A program method for a non-volatile memory device comprising:
    programming a first multi-level cell among multi-level cells of the non-volatile memory device to a first state of a first group of states according to a first verify voltage level of a first group of verify voltage levels; and
    re-programming the first multi-level cell to a first state of a second group of states according to a first verify voltage level of a second group of verify voltage levels, each verify voltage level of the second group of verify voltage levels having a higher verify voltage level than any verify voltage levels of the first group of verify voltage levels,
    wherein one of the states of the second group of states includes at least one of the states of the first group of states.

14. The program method of claim 13, wherein the re-programming comprises:
    increasing each verify voltage level of the first group of verify voltage levels up to a corresponding higher verify voltage level of the second group of verify voltage levels; and
    re-programming one of the plurality of programmed states in the first multi-level cell according to one of the verify voltage levels of the second group of verify voltage levels.

15. The program method of claim 14, wherein the one of states of the second group of states that includes all of the states of the first group of states.

16. The program method of claim 15, wherein the one of states of the second group of states is an erase state.

17. The program method of claim 14, wherein the re-programming further comprises increasing the first verify voltage level of the first group of verify voltage levels, prior to raising it to the first verify voltage level of the second group of verify voltage levels, to be raised a separate verify voltage level within a range of levels covered by the first group of verify voltage levels.

18. The program method of claim 13, wherein the number of states of the second group of states may be adjusted by a control circuit.

19. A read method for a non-volatile memory device comprising:
    providing a first read voltage to a selected word line to read a particular bit of a multi-bit memory cell;
    determining whether the memory cell is in a re-programmed state based on the first provided read voltage;
    providing a second read voltage to the selected word line to read the particular bit of the memory cell, when it is determined that the memory cell is not in a re-programmed state; and
    reading the particular bit according to the second read voltage,
    wherein a level of the second read voltage is smaller than a level of the first read voltage.

20. The read method of claim 19, wherein the level of the first read voltage is determined based on the data of a flag cell.

* * * * *